US009870985B1

(12) United States Patent
Mangrum

(10) Patent No.: US 9,870,985 B1
(45) Date of Patent: Jan. 16, 2018

(54) SEMICONDUCTOR PACKAGE WITH CLIP ALIGNMENT NOTCH

(71) Applicant: Amkor Technology Inc., Tempe, AZ (US)

(72) Inventor: Marc Alan Mangrum, Manchaca, TX (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/207,462

(22) Filed: Jul. 11, 2016

(51) Int. Cl.
*H01L 23/49* (2006.01)
*H01L 23/495* (2006.01)
*H01L 23/00* (2006.01)

(52) U.S. Cl.
CPC .. *H01L 23/49575* (2013.01); *H01L 23/49513* (2013.01); *H01L 23/49517* (2013.01); *H01L 23/49562* (2013.01); *H01L 23/49565* (2013.01); *H01L 24/69* (2013.01); *H01L 2224/69* (2013.01)

(58) Field of Classification Search
CPC ......... H01L 23/49575; H01L 23/49513; H01L 23/49517; H01L 23/49562; H01L 23/49565; H01L 24/69
See application file for complete search history.

(56) References Cited

U.S. PATENT DOCUMENTS

| | | | | |
|---|---|---|---|---|
| 4,994,412 A * | 2/1991 | Kalfus | ............... | H01L 23/49537 257/E23.042 |
| 5,277,356 A * | 1/1994 | Kawauchi | ............... | B23K 20/10 228/111 |
| 6,069,408 A * | 5/2000 | Honda | .................. | H01L 21/565 257/675 |
| 6,127,206 A * | 10/2000 | Nakamichi | ....... | H01L 23/49541 257/666 |
| 6,353,257 B1 * | 3/2002 | Huang | .................. | H01L 23/057 257/666 |
| 6,455,348 B1 * | 9/2002 | Yamaguchi | ........... | H01L 21/561 257/666 |
| 6,563,199 B2 * | 5/2003 | Yasunaga | ............... | H01L 21/561 257/666 |
| 6,599,773 B2 * | 7/2003 | Tsuji | ................. | H01L 23/49548 257/E23.046 |
| 7,005,325 B2 * | 2/2006 | Chow | ..................... | H01L 21/56 257/676 |
| 7,443,015 B2 * | 10/2008 | Punzalan | .......... | H01L 23/49503 257/673 |
| 9,184,117 B2 * | 11/2015 | Ho | ....................... | H01L 23/4952 |

(Continued)

*Primary Examiner* — Ida M Soward
(74) *Attorney, Agent, or Firm* — Kevin B. Jackson

(57) ABSTRACT

An electronic component includes a leadframe and a first semiconductor die. The leadframe includes a leadframe top side, a leadframe bottom side opposite the leadframe top side, and a top notch at the leadframe top side. The top notch includes a top notch base located between the leadframe top side and the leadframe bottom side, and defining a notch length of the top notch, and can also include a top notch first sidewall extended, along the notch length, from the leadframe top side to the top notch base. The first semiconductor die can include a die top side a die bottom side opposite the die top side and mounted onto the leadframe top side, and a die perimeter. The top notch can be located outside the die perimeter. Other examples and related methods are also disclosed.

22 Claims, 4 Drawing Sheets

(56) References Cited

U.S. PATENT DOCUMENTS

| | | | |
|---|---|---|---|
| 2007/0023873 A1* | 2/2007 | Park | H01L 23/24 257/666 |
| 2007/0099349 A1* | 5/2007 | Adachi | G01C 17/30 438/123 |
| 2007/0298544 A1* | 12/2007 | Oman | H01L 21/4832 438/123 |
| 2008/0067643 A1* | 3/2008 | Tanaka | H01L 21/4842 257/666 |
| 2011/0111562 A1* | 5/2011 | San Antonio | H01L 21/4832 438/113 |
| 2013/0001804 A1* | 1/2013 | Shimanuki | H01L 21/565 257/782 |
| 2013/0037837 A1* | 2/2013 | Kang | H01L 33/486 257/98 |
| 2013/0181332 A1* | 7/2013 | Kelkar | H01L 23/3107 257/666 |
| 2013/0309816 A1* | 11/2013 | Xue | H01L 23/49562 438/123 |
| 2014/0159076 A1* | 6/2014 | Sota | H01L 33/60 257/88 |
| 2014/0191380 A1* | 7/2014 | Lee | H01L 24/97 257/676 |
| 2014/0239471 A1* | 8/2014 | Khunpukdee | H01L 24/97 257/676 |
| 2014/0264797 A1* | 9/2014 | Ota | H01L 23/49541 257/674 |
| 2016/0013378 A1* | 1/2016 | Sakamoto | H01L 33/48 257/99 |
| 2016/0079507 A1* | 3/2016 | Lee | H01L 33/486 257/98 |
| 2016/0247991 A1* | 8/2016 | Sasaoka | H05K 1/0313 |
| 2016/0308104 A1* | 10/2016 | Sasaoka | H01L 25/0753 |
| 2017/0033271 A1* | 2/2017 | Gruendl | H01L 33/486 |

* cited by examiner

SEMICONDUCTOR PACKAGE WITH CLIP ALIGNMENT NOTCH

TECHNICAL FIELD

The present invention relates, in general, to electronics, and more particularly, to semiconductor packages with clip alignment notch and related methods.

BACKGROUND

Present semiconductor packages and methods for producing such packages can suffer from inconsistencies, for example, due to variability when forming or coupling packaging elements of such packages. For example, when a conductive clip is attached to a leadframe, planar alignment and/or coupling between the conductive and a semiconductor die can be affected due to manufacturing or tool wear variations in the clip tail length and/or the clip bend angle of such clip. Accordingly, it is desirable to have semiconductor packaging structures and methods that address the issues noted previously as well as others while being cost effective and easily incorporable into manufacturing flows.

Figure 1:
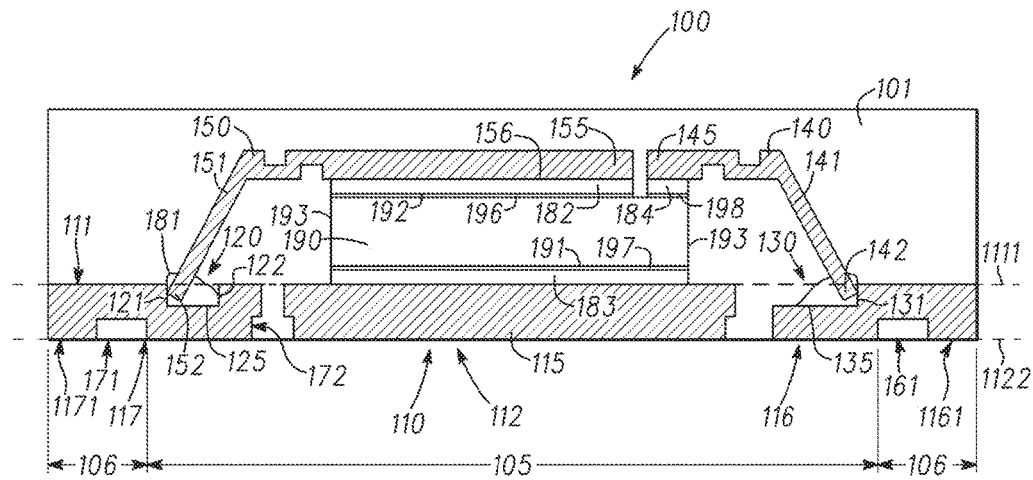
FIG. 1 presents a cross-sectional side view of an electronic component in accordance with embodiment of the present disclosure.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

As used herein, the terms "and/or" and "or" include any and all combinations of one or more of the associated listed items. As used herein, the singular forms are intended to include the plural forms as well, unless the context clearly indicates otherwise. Additionally, the term "while" means a certain action occurs at least within some portion of a duration of the initiating action.

It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof.

It will be understood that the terms "first," "second," etc. may be used herein to describe various, elements, and that these elements should not be limited by these terms. These terms are only used to distinguish one element from another. Thus, for example, a first member, a first element, a first region, a first layer and/or a first section discussed below could be termed a second member, a second element, a second region, a second layer and/or a second section without departing from the teachings of the present disclosure.

Similarly, various spatial terms, such as "upper," "lower," "side," "top," "bottom," "over", "under," and the like, may be used in distinguishing one element from another element in a relative manner. It should be understood, however, that elements may be oriented in different manners, for example a device may be turned sideways so that its "top" surface is facing horizontally and its "side" surface is facing vertically, without departing from the teachings of the present disclosure.

The terms "couple," "coupled," "couples," "coupling," and the like should be broadly understood and refer to connecting two or more elements or signals, electrically, mechanically or otherwise. Coupling (whether mechanical, electrical, or otherwise) may be for any length of time, e.g., permanent or semi-permanent or only for an instant. Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B). Similarly, unless specified otherwise, as used herein the word "over" or "on" includes orientations, placements, or relations where the specified elements can be in direct or indirect physical contact.

Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may.

The use of the word "about," "approximately," or "substantially" means a value of an element is expected to be close to a stated value or position. However, as is well known in the art there are always minor variances preventing values or positions from being exactly stated.

Furthermore, the particular features, structures or characteristics may be combined in any suitable manner, as would be apparent to one of ordinary skill in the art, in one or more embodiments.

It is further understood that the embodiments illustrated and described hereinafter suitably may have embodiments and/or may be practiced in the absence of any element that is not specifically disclosed herein.

DESCRIPTION

In one embodiment, an electronic component can comprise a leadframe and a first semiconductor die. The leadframe can comprise a leadframe top side, a leadframe bottom side opposite the leadframe top side, and a top notch at the leadframe top side. The top notch can comprise a top notch base located between the leadframe top side and the leadframe bottom side, and defining a notch length of the top notch, and can also comprise a top notch first sidewall extended, along the notch length, from the leadframe top side to the top notch base The first semiconductor die can comprise a die top side a die bottom side opposite the die top side and mounted onto the leadframe top side, and die sidewalls located between the die top side and the die bottom side and defining a die perimeter. The top notch can be located outside the die perimeter.

In one embodiment, an electronic component can comprise a leadframe, a leadframe top plane, a leadframe bottom plane parallel to the leadframe top plane. The leadframe can comprise a leadframe top side comprising a leadframe top end along which the leadframe top plane extends, a leadframe bottom side comprising a leadframe bottom end along which the leadframe bottom plane extends. The leadframe can also comprise comprising a top notch base located between the leadframe top plane and the leadframe bottom plane, and defining a notch length of the top notch and a top notch first sidewall extended, along the notch length, from the leadframe top side to the top notch base. The first semiconductor die can comprise a die top side, a die bottom side mounted on the leadframe top side, and die sidewalls located between the die top side and the die bottom side, and defining a die perimeter. The top notch can be located outside the die perimeter.

In one implementation, a method for providing an electronic component can comprise mounting a first semiconductor die on a first side of a leadframe having a top notch and coupling a clip from the top notch to a die top side of the first semiconductor die. The leadframe can comprise a leadframe top side comprising a leadframe top end, along which a leadframe top plane extend, and a leadframe bottom side comprising a leadframe bottom end along which the leadframe bottom plane extends. The leadframe can also comprise a top notch comprising a top notch base located between the leadframe top plane and the leadframe bottom plane, and defining a notch length of the top notch, and a top notch first sidewall extended along the notch length from the leadframe top side to the top notch base. The first semiconductor die can comprise a die top side, a die bottom side mounted on the leadframe top side, and die sidewalls located between the die top side and the die bottom side and defining a die perimeter. The clip can comprise a clip edge inserted into the top notch. The clip can protrude from the top notch, past the leadframe top side, to the die top side.

Other examples and embodiments are further disclosed herein. Such examples and embodiments may be found in the figures, in the claims, and/or in the present disclosure.

Figure 2:
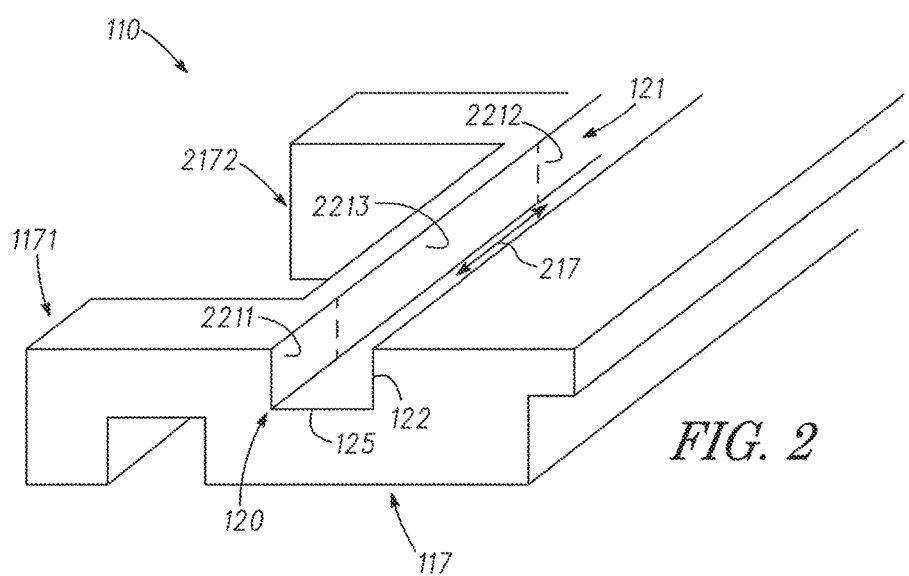
FIG. 2 presents a perspective view of part of a lead of a leadframe of the electronic component, showing a portion of a top notch thereat.
Figure 3:
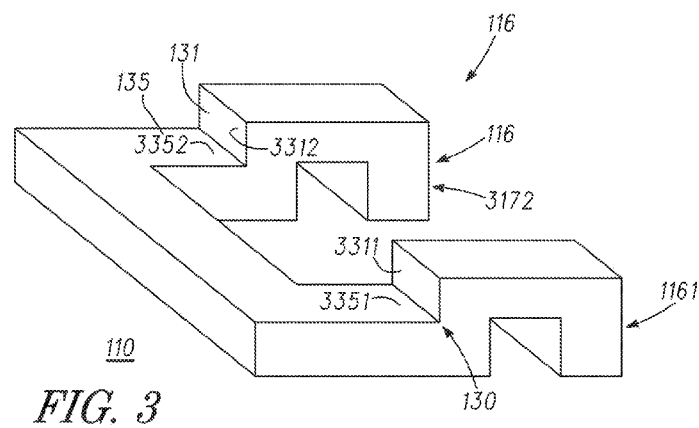
FIG. 3 presents a perspective view of part of another lead of the leadframe of the electronic component, showing a portion of a top notch thereat.
Figure 4:
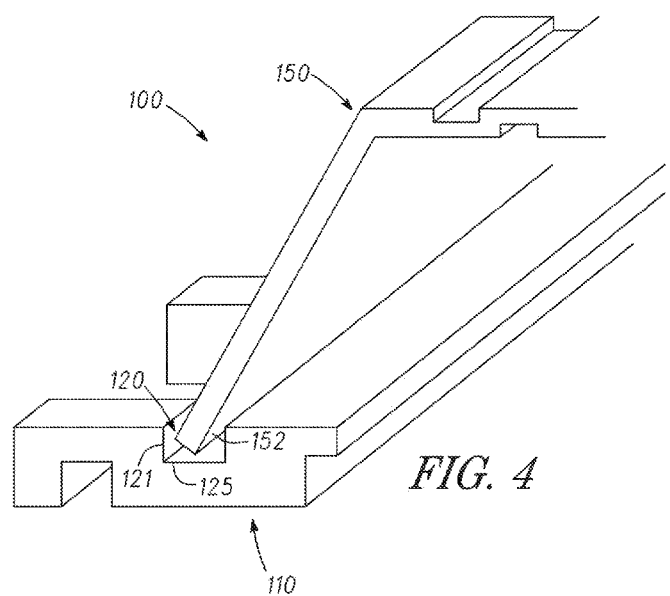
FIG. 4 illustrates the perspective view of FIG. 2, having a clip coupled to the top notch.

Turning to the drawings, FIG. 1 presents a cross-sectional side view of electronic component 100 in accordance with one embodiment of the present disclosure. FIG. 2 presents a perspective view of part of lead 117 of leadframe 110 of electronic component 100, showing a portion of top notch 120 thereat. FIG. 3 presents a perspective view of part of lead 116 of leadframe 110 of electronic component 100, showing a portion of top notch 130 thereat. FIG. 4 illustrates the perspective view of FIG. 2 having clip 150 coupled to top notch 120. Electronic component 100 can comprise a semiconductor leadframe-based package configured, for example, for high-power and/or high-current requirements in some implementations.

As can be seen in FIGS. 1-2, leadframe 110 comprises leadframe top side 111 and leadframe bottom side 112 opposite leadframe top side 111. Leadframe top side 111 includes a top end of leadframe 110, where such top end can comprise a topmost point or top surface of leadframe 110. Leadframe bottom side 112 includes a bottom end of leadframe 110, where such bottom end can comprise a lowest point or lowest surface of leadframe 110. Leadframe 110 defines leadframe top plane 1111, which extends along the top end of leadframe 110, and leadframe bottom plane 1122, which can be parallel to leadframe top plane 1111 and extends along the bottom end of leadframe 110.

Leadframe 110 also comprises paddle 115, and leads 116-117 in the present embodiment. Leads 116-117 extend from center zone 105 to perimeter 106 of electronic component 100. Paddle 115 is shown located at center zone 105 in the present illustration, but in the same or other examples, it can be or can comprise a lead extending to perimeter 106 in, for instance, a direction non-planar and/or orthogonal to the cross-sectional plane presented in FIG. 1. As can be seen in FIGS. 2-4, leads 116-117 can each comprise multiple lead legs coupled together by a bridge there between. Leadframe 110 further comprises top notch 120 extended into lead 117 from leadframe top side 111.

Semiconductor die 190 is located over leadframe 110, where die side 191 is mounted, using fusing structure 183, onto leadframe top side 111 and over paddle 115. Accordingly, both die 190 and top notch 120 are located at the same leadframe top side 111. Die side 192 faces away from leadframe 110, and die sidewalls 193 extend between die side 192 and die side 191, defining a die perimeter of semiconductor die 190. Leadframe 110 can be used to interface die 190 to the outside of electronic component 100, and can comprise a conductive material such as copper and/or alloys thereof.

Top notch 120 is located outside the die perimeter of semiconductor die 190, thus being available for receiving conductive clip 150. In the present embodiment, top notch 120 is accessible at leadframe top side 111 and comprises top notch base 125, top notch sidewall 121, and top notch sidewall 122. Top notch base 125 is located between leadframe top side 111 and leadframe bottom side 112, thus being sunk with respect to leadframe top side 111. Top notch base 125 also is located between leadframe top plane 1111 and leadframe bottom plane 1122.

Top notch sidewall 121 extends, along notch length 217, from leadframe top side 111 to top notch base 125. Top notch sidewall 122 is similar to top notch sidewall 121 but opposite thereto across top notch base 125, such that top notch sidewall 122 is closer to die 190 than top notch sidewall 121. In some examples, however, top notch sidewall 122 can be optional, such that top notch base 125 could extend towards die 190 from top notch sidewall 121 to the edge of lead 117, similar to the configuration of top notch 130 of lead 116.

In some implementations, top notch 120 can be formed by etching into leadframe 110, where such etching can be carried out, for example, via chemical etching or via laser etching, to define etched surfaces of top notch sidewall 121, top notch sidewall 122, and/or top notch base 125. Such chemical etching may comprise an etchant such as ferric chloride, ammonium phosphate, and/or CuClAHAS (Copper Chloride in Aqueous Hydrochloric Acid Solution) in some implementations. Such laser etching may comprise a laser etch such as a LEEP process (Laser Evolved Etching Process) with LDI (Laser Defined Imaging) in some implementations. Top notch 120 can also be formed mechanically, for example, by stamping or coining, ablating, sawing, water jetting, and/or grinding leadframe 110. A top notch similar to top notch 120 can also be formed by bending leadframe 110 in some embodiments. Although the figures tend to show the surfaces and junctions of top notch sidewall 121, top notch sidewall 122, and top notch base 125 as substantially planar and orthogonal, such surfaces and junctions can comprise non-planarities and/or can be seen as arcuate, such as U-shaped or V-shaped, depending on the zoom-level and/or on the chemical or mechanical formation process used.

As seen in FIGS. 1 and 2, lead 117 comprises lead leg 1171, where an inner end thereof defines sidewall section 2211 of top notch sidewall 121. Lead 117 also comprises lead leg 2172, where an inner end thereof defines sidewall section 2212 of top notch sidewall 121. In the present example, top notch sidewall 121 is continuous throughout notch length 217, comprising sidewall section 2213 extending between the inner ends of lead legs 1171 and 2172, from sidewall section 2211 to sidewall section 2212. In the present example, top notch base 125 also is continuous throughout notch length 217. There can be embodiments, however, where top notch sidewall 121 can be discontinuous, comprising intermittent segments along notch length 217, such as by omitting sidewall section 2213. There can also be embodiments where top notch base 125 can be discontinuous, comprising intermittent segments along notch length 217.

As seen in FIGS. 1 and 3, lead 116 can be similar to lead 117, and comprises top notch 130 in the present embodiment. Top notch 130 is configured to receive to receive clip edge 142 of clip tail 141 of clip 140 (FIG. 1) much as described herein for clip 150 as received in top notch 120 (FIGS. 1, 2, 4). Top notch 130 comprises top notch base 135 and top notch sidewall 131, which can be respectively similar to top notch base 125 and top notch sidewall 121 of top notch 120 (FIGS. 1-2). Lead 116 comprises lead leg 1161, where an inner end thereof defines sidewall section 3311 of top notch sidewall 131. Lead 116 also comprises lead leg 3172, where an inner end thereof defines sidewall section 3312 of top notch sidewall 131. In the present example, top notch sidewall 131 is discontinuous between the inner ends of lead legs 1161 and 3172, where sidewall sections 3311 and 3312 can be coplanar but are intermittent or separated from each other by a gap. In the present example, top notch base 135 also is discontinuous between the inner ends of lead legs 1161 and 3172, where base sections 3351 and 3352 can be coplanar but are intermittent or separated from each other by a gap. There can be embodiments, however, where top notch sidewall 131 can be continuous, and/or where top notch base 135 can be continuous.

FIGS. 1-4 show leads 116 and 117 comprising respective bottom notches at leadframe bottom side 112, such as bottom notches 171 and 172 of lead 117, and bottom notch 161 of lead 116. For example, bottom notch 171 comprises a bottom notch base located between leadframe top side 111 and leadframe bottom side 112, and thereby sunk with respect to leadframe bottom side 112. Bottom notch 171 also comprises a bottom notch sidewall extended from leadframe bottom side 112 to its bottom notch base, and adjacent its bottom notch base. Bottom notches 172 and 161 also comprise similar respective bottom notch bases and bottom notch sidewalls. In some examples, the bottom notch bases and/or bottom notch sidewalls of bottom notches 171, 172, and/or 161 can be similar, other than with respect their location at leadframe bottom side 112, to the top notch sidewalls and top notch bases described herein, such as those of top notches 120 and 130. Bottom notches 171, 172, and 161 can comprise or serve as locking features for fortifying adhesion or clasping between encapsulant 101 and leadframe 110. In some implementations, a depth of bottom notches 171, 172, and/or 161 can be greater than the depth of any of top notches 120 or 130.

As seen in FIGS. 1 and 4, Clip 150 comprises clip tail 151 having clip edge 152 inserted into top notch 120, where the rest of clip tail 151 protrudes from top notch 120 past leadframe top side 111. Clip edge 152 is fused to leadframe 110 by fusing structure 181 in top notch 120, where such fusing structure 181 can extend between the bottom of clip edge 152 and top notch base 125. In some examples, fusing structure 181 can completely fill top notch 120. In the same or other examples, fusing structure 181 can overfill top notch 120 and may extend on at least a portion of leadframe top side 111. In some examples, fusing structure 181 can be a solder paste, an epoxy material, or a conductive sintering material. In the same or other examples, fusing structure 181 can be formed via laser or ultrasonic attachment.

Clip 150 also comprises clip roof 155 coupled to clip tail 151 at an angle or bend there between, where clip 150 can be bent, stamped, or otherwise formed from a conductive material that can be similar or the same as one or more of the materials described with respect to the material of leadframe 110 in some implementations. In the present embodiment, clip roof bottom 156 of clip roof 155 is coupled to die side 192 of die 190 via fusing structure 182 located therebetween. There can be examples where fusing structures 182 and/or 183 can comprise material(s) similar to one or more of the materials described above with respect to fusing structure 181.

Top notch 120 can account for variations in the length of clip tail 151 to prevent such variations from affecting the alignment or coupling of clip 150 over die 190 and/or over leadframe 110. For example, in some implementations when fusing structures 181 and 182 are reflowed, if clip tail 151 is longer than necessary due to, for example, manufacturing variations, then the bottom of clip edge 152 can sink as needed below a height of leadframe top side 111 and into top notch 120, thereby preventing clip edge 152 from bottoming-out and tilting clip 150. Accordingly, the depth of top notch base 125 relative to the leadframe top side 111 can prevent the bottom of the clip edge 152 from directly contacting top notch base 125, thereby mitigating clip tilting about clip edge 152 that could otherwise cause non-planar alignment and/or reduced coupling between clip roof bottom 156 and die side 192, and/or inconsistent thickness of fusing structure 182. The depth of top notch base 125 and/or the height of top notch sidewall 121 can range from approximately at least 10 microns up to half of a thickness of leadframe 110, thereby accommodating for manufacturing or tolerance variations in clip tail length. For instance, if leadframe 110 were approximately 200 microns thick, top notch 120 can be up to 100 microns deep.

In some embodiments, die 190 can comprise a power device, such as a field effect transistor (FET) die, which can have a source terminal, a gate terminal, and a drain terminal. Die 190 comprises die terminal 196 at die side 192, which can be coupled to clip roof bottom 156 through fusing structure 182. Die 190 also comprises die terminal 197 at die side 191, which can be coupled to leadframe 110 through fusing structure 183. Die 190 further comprises die terminal 198 at die side 192, which is shown coupled to lead 116 of leadframe 110 through a connector that in the present embodiment comprises clip 140 coupled to top notch 130, but can comprise other connector types, such as a wirebonding wire or a wire ribbon in other embodiments. In some implementations, die terminal 196 can comprise the source terminal of die 190, while die terminal 197 can comprise the drain terminal of die 190. However, there can be implementations where terminal 196 can comprise the drain terminal of die 190 while die terminal 197 can comprise the source terminal of die 190. Die terminal 198 can comprise the gate terminal of die 190.

As seen in the embodiment of FIGS. 1 and 4, clip edge 152 of clip 150 can directly contact top notch sidewall 121 when inserted into top notch 120. For example, clip edge 152 can lie against top notch sidewall 121 along and/or throughout substantially an entire length of clip edge 152. Such positioning of clip edge 152 permits top notch sidewall 121 to act as a brace for assisting in lining up clip 150 relative to leadframe 110 and/or die 190. In addition, such positioning of clip edge 152, within top notch 120 and/or against top notch sidewall 121, can restrict clip 150 from yawing or tweezing during, for example, reflowing of fusing structure 181.

Figure 5:
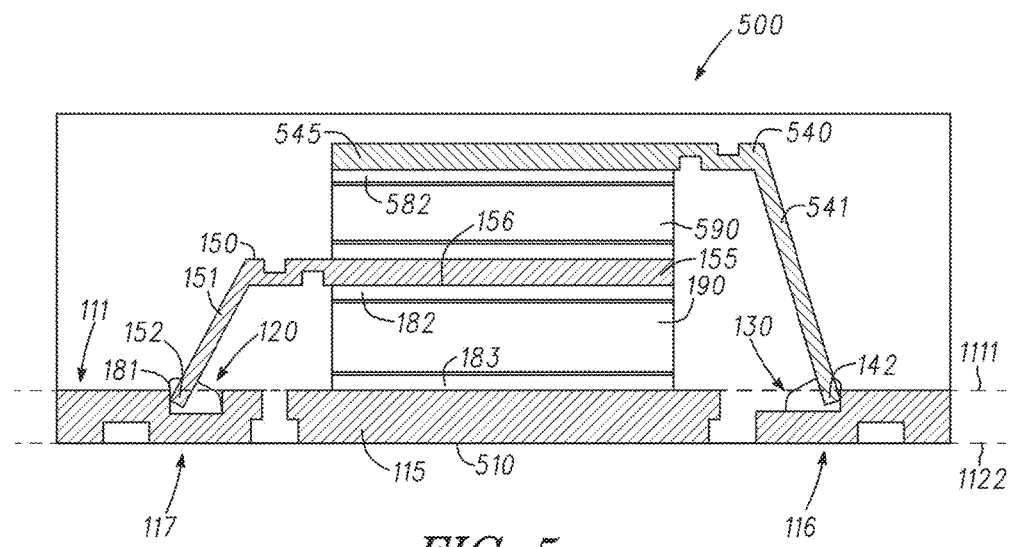
FIG. 5 illustrates a cross-sectional side view of an electronic component in accordance with an embodiment of the present disclosure.

FIG. 5 illustrates a cross-sectional side view of electronic component 500 in accordance with one embodiment of the present disclosure. Electronic component 500 is similar to electronic component 100 described above, such that the respective description thereof applies hereto, and also comprises die 590 stacked over die 190. Electronic component 500 includes leadframe 110 with notches 120 and 130, and clip 150 as described above with respect to electronic component 100, but also comprises the bottom side of die 590 mounted over clip roof 155 of clip 150, and clip 540 over die 590. Clip 540 is similar to clip 140, but its clip tail 541 is longer to accommodate the stacked height of die 590 over die 190, and the bottom of its clip roof 545 is coupled instead to the top side of die 590 through fusing structure 582.

Figure 6:
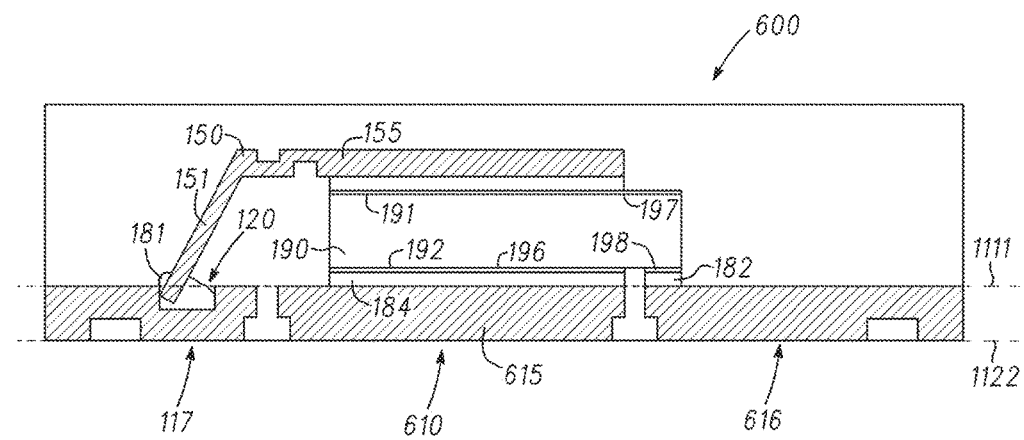
FIG. 6 illustrates a cross-sectional side view of an electronic component in accordance with an embodiment of the present disclosure.

FIG. 6 presents a cross-sectional side view of electronic component 600 in accordance with one embodiment of the present disclosure. Electronic component 600 is similar to electronic component 100 described above, such that corresponding descriptions thereof apply hereto. Leadframe 610 is similar to leadframe 110 (FIGS. 1-5), but is configured to support flipchip or flipped die mounting of die 190 thereon, where die side 192 and corresponding die terminals 196 and 198 are coupled to the top side of leadframe 610. Die terminal 198 is coupled to lead 616 in the present example, where lead 616 can be similar to leads 116 or 117 (FIGS. 1-5), such as by extending to a perimeter of electronic component 600, but need not comprise a top notch like top notch 120 or 130 (FIGS. 1-5). Die terminal 196 is coupled in the present example to die paddle 615, which can be similar to die paddle 115 (FIGS. 1-5), and/or can be a lead similar to lead 616 extending to a perimeter of electronic component 600. Electronic component 600 can thus comprise a chip-on-lead configuration. The present example also shows clip 150 coupling die 190 to lead 117, with clip tail 151 anchored thereat via top notch 120. Because die 190 is flipped in FIG. 6 relative to the embodiments of FIGS. 1-5, clip roof 155, is instead coupled to die side 191 and terminal 197 thereof.

In the present example of FIG. 6, die terminals 196 and 198 are respectively coupled to die paddle 615 and lead 616 through fusing structure 184 and 182. In some examples, fusing structure 184 and 182 can comprise solder, and/or can be defined via solder stencil patterning. There can be examples where fusing structures 184 and/or 182 can comprise respective flipchip bump(s) coupling to die paddle 615 or lead 616, where such flipchip bumps can comprise solder bumps and/or metallic pillars.

Although electronic component 600 is shown in FIG. 6 in a non-stacked configuration, there can be embodiments where electronic component 600 can comprise a stacked die configuration similar to that of FIG. 5, where die 590 would be mounted over clip roof 155, where lead 616 would comprise a top notch like top notch 120 or 130 (FIGS. 1-5), and/or where clip 540 would couple die 590 to such top notch of lead 616.

Figure 7:
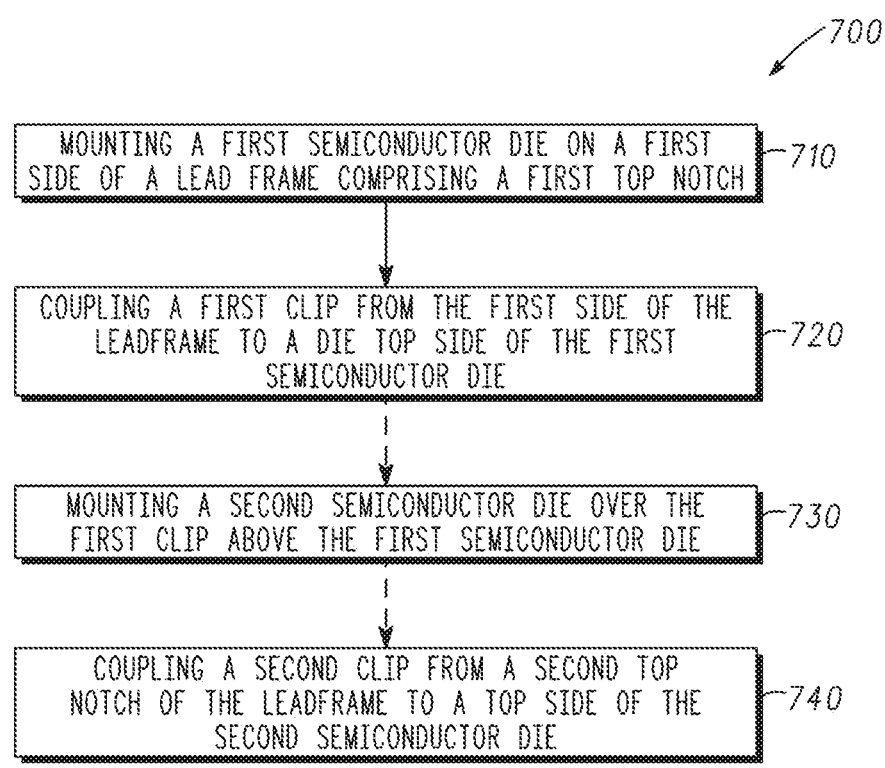
FIG. 7 presents a flowchart of a method for providing an electronic component.

FIG. 7 presents a flowchart of a method 700 for providing an electronic component. In some embodiments, the electronic component of method 700 can be similar to one or more of electronic components 100, 500, and/or 600 as shown in FIGS. 1-6 herein, or to variations or combinations thereof.

Block 710 of method 700 comprises mounting a first semiconductor die on a first side of a leadframe comprising a first top notch. For instance, the first semiconductor die can be similar to die 190 as mounted on leadframe 110 (FIGS. 1, 5). As another example, the first semiconductor die can be similar to die 190 as mounted on leadframe 610 (FIG. 6), or otherwise flipchip mounted in, for example, a chip on lead configuration such that multiple terminals thereof contact the first side of the leadframe.

The leadframe of Block 710 can be similar to leadframe 110 (FIGS. 1-5), leadframe 510 (FIG. 5), leadframe 610 (FIG. 6), or variations thereof. The leadframe can comprise a leadframe top side having a top end, along which a leadframe top plane extends, such as described above as example with respect to leadframe top side 111 (FIGS. 1-5) or the top side of leadframe 610 (FIG. 6), and corresponding leadframe top end 1111 (FIGS. 1-6). Similarly, the leadframe can comprise a leadframe bottom side having a bottom end, along which a leadframe bottom plane extends, such as described above as example with respect to leadframe bottom side 112 (FIGS. 1-5) or bottom top side of leadframe 610 (FIG. 6), and corresponding leadframe bottom end 1122 (FIGS. 1-6).

The leadframe of block 710 can also have the first top notch at the top side thereof, where such first top notch can comprise a top notch base and a top notch first sidewall. The top notch base can be located between the leadframe top plane and the leadframe bottom plane, and can define a notch length of the first top notch. The top notch first sidewall can extend along the top notch length, from the leadframe top side and/or the leadframe top plane to the top notch base. The first top notch can also optionally comprise a top notch second sidewall that can also extend along the top notch length, from the leadframe top side and/or the leadframe top plane to the top notch base, where such top notch second sidewall face the top notch first sidewall across the top notch base. The top notch base, top notch first sidewall, and/or top notch second sidewall can be continuous or discontinuous, depending on the embodiment. In some implementations, the first top notch can be similar to top notch 120 or 130, with their respective top notch bases 125 or 135, and/or with their respective sidewalls 121, 122, or 131 (FIGS. 1-6).

Block 720 of method 700 comprises coupling a first clip from the first top notch to a die top side of the first semiconductor die. The first clip can comprise a clip tail having a clip roof coupled to the die top side, and a clip edge coupled to the first top notch of the leadframe, where a clip tail of the first clip can protrude from the first top notch and couple to the clip roof. In some examples, the first clip can be similar to clip 140 (FIG. 1), clip 150 (FIGS. 1, 4-6), and/or clip 540 (FIG. 5) described herein. For instance, the first clip can be similar to clip 150 (FIGS. 1, 4-6), having clip edge 152 of clip tail 151 coupled to top notch 120, and having clip roof 155 coupled to die side 192 of die 190. In the same or other examples, the first clip can be similar to clip 140 (FIG. 1), having clip edge 142 of clip tail 141 coupled to top notch 130, and having clip roof 145 coupled to die side 192 of die 190.

Block 730 of method 700 comprises mounting a second semiconductor die over the first clip above the first semiconductor die. In some examples, the second semiconductor die can be similar to die 590 mounted over clip roof 155 of clip 150 and above die 190 (FIG. 5).

Block 740 of method 700 comprises coupling a second clip from a second top notch of the leadframe to a top side of the second semiconductor die. In some examples, the second clip can be similar to clip 540 having clip roof 545 coupled to the top side of die 590, and clip edge 142 coupled to top notch 130 (FIG. 5). Such second clip can have a clip tail that is longer than the clip tail of the first clip to accommodate the height of the stacked configuration of the first and second semiconductor dies.

As stated herein, the scope of the present disclosure is not limited to the specific example method blocks (or associated structures) discussed. For example, various blocks (or portions thereof) may be removed from or added to the example method 700, various blocks (or portions thereof) may be reordered, various blocks (or portions thereof may be modified), etc. For example, blocks 730 and/or 740 can be optional in some implementations.

While the subject matter of this disclosure is described with specific preferred embodiments and example embodiments, the foregoing drawings and descriptions thereof depict only illustrative embodiments of the subject matter, and are not therefore to be considered limiting of its scope. It is evident that many alternatives and variations will be apparent to those skilled in the art. For instance, specific implementations of the top notches described herein can vary, where for example top notches 120-130 can be interchangeable with each other. As another example, the structures and elements described herein can be used with other substrate types, including laminate or other substrates having one or more top notches at a top side thereof, and corresponding clip(s) coupled between such top notch(es) and respective semiconductor die(s). Although the present description primarily uses a QFN/MLF or QFP leadframe substrate for illustrative purposes, it is understood that applying these concepts to other leadframe substrates, such as routable-MLF (RtMLF) or molded interconnect system (MIS), as well as to laminate substrate design, is possible while providing the same or similar benefits. In the case of a laminate design, a leadframe may still be utilized to enable the conductive leadfinger formation and interconnect to the device mounted on a laminate substrate.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

The invention claimed is:

1. An electronic component comprising:
   a leadframe top plane;
   a leadframe bottom plane parallel to the leadframe top plane;
   a leadframe comprising:
      a leadframe top side comprising:
         a leadframe top end, along which the leadframe top plane extends;
      a leadframe bottom side comprising:
         a leadframe bottom end, along which the leadframe bottom plane extends;
      and
      a top notch comprising:
         a top notch base located between the leadframe top plane and the leadframe bottom plane, and defining a notch length of the top notch; and
         a top notch first sidewall extended, along the notch length, from the leadframe top side to the top notch base;
   a first semiconductor die comprising:
      a die top side;
      a die bottom side mounted on the leadframe top side; and
      die sidewalls, located between the die top side and the die bottom side, and defining a die perimeter;
   wherein the top notch is located outside the die perimeter,
   a clip comprising:
      a clip tail having a clip edge inserted into the top notch such that a bottom of the clip edge is beneath the leadframe top side; and
      a clip roof coupled to the clip tail;
   wherein:
      the clip roof is attached to the first semiconductor die;
      the clip tail protrudes from the top notch past the leadframe top side;
      the bottom of the clip edge adjoins the top notch first sidewall at an angle; and
      a depth of the top notch base relative to the leadframe top side prevents the bottom of the clip edge from direct contact with the top notch base.

2. The electronic component of claim 1, further comprising:
   a fusing structure extending between the bottom of the clip edge and the top notch base, wherein the fusing structure fuses the clip edge in the top notch.

3. The electronic component of claim 2, wherein:
   the top notch comprises:
      a notch second sidewall opposite, across the top notch base, to the notch first sidewall;
   the notch second sidewall is closer to the first semiconductor die than the top notch first sidewall; and
   the fusing structure extends to physically contact the notch second sidewall.

4. The electronic component of claim 1, wherein:
   the top notch base and the top notch first sidewall comprise respective portions of the leadframe top side; and
   the bottom of the clip edge is completely beneath the leadframe top side.

5. An electronic component comprising:
   a leadframe comprising:
      a leadframe top side;

a leadframe bottom side opposite the leadframe top side; and
a top notch at the leadframe top side and comprising:
a top notch base located between the leadframe top side and the leadframe bottom side, and defining a notch length of the top notch; and
a top notch first sidewall extended, along the notch length, from the leadframe top side to the top notch base; and
a first semiconductor die comprising:
a die top side;
a die bottom side opposite the die top side and mounted onto the leadframe top side; and
die sidewalls, located between the die top side and the die bottom side, and defining a die perimeter;
wherein the top notch is located outside the die perimeter; and
a clip comprising:
a clip tail having a clip edge inserted into the top notch such that a bottom of the clip edge is beneath the leadframe top side;
wherein:
the clip tail protrudes from the top notch past the leadframe top side;
the bottom of the clip edge adjoins the top notch first sidewall at an angle; and
a depth of the top notch base relative to the leadframe top side prevents the bottom of the clip edge from direct contact with the top notch base.

6. The electronic component of claim 5, wherein the top notch base is discontinuous.

7. The electronic component of claim 5, wherein:
the clip edge directly contacts the top notch first sidewall along a corner of the clip edge.

8. The electronic component of claim 5, wherein:
the clip edge is fused to the notch by a solder material that extends between the bottom of the clip edge and the top notch base.

9. The electronic component of claim 5, wherein:
the clip comprises a clip roof coupled to the clip tail; and
a clip roof bottom of the clip roof is coupled to the die top side.

10. The electronic component of claim 9, wherein:
the die top side comprises:
a gate terminal coupled to the leadframe top side at a lead of the leadframe; and
one of a source terminal or a drain terminal coupled to the clip roof bottom through a fusing structure.

11. The electronic component of claim 5, further comprising:
a second semiconductor die located over the first semiconductor die;
wherein:
the clip comprises a clip roof coupled to the clip tail; and
a clip roof bottom of the clip roof is coupled to a top side of the second semiconductor die.

12. The electronic component of claim 5, wherein:
the top notch base and the top notch first sidewall are defined by respective etched surfaces.

13. The electronic component of claim 5, wherein:
the top notch base and the top notch first sidewall are continuous throughout the notch length.

14. The electronic component of claim 5, wherein:
the die bottom side comprises:
a gate terminal coupled to the leadframe top side at a first lead of the leadframe; and
one of a source terminal or a drain terminal coupled through a fusing structure to at least one of a second lead or a paddle of the leadframe.

15. The electronic component of claim 5, wherein:
the top notch comprises:
a notch second sidewall extended, along the notch length, from the leadframe top side to the top notch base;
wherein the notch second sidewall is closer to the first semiconductor die than the top notch first sidewall.

16. The electronic component of claim 5, wherein:
the leadframe comprises a lead having a bottom notch at the leadframe bottom side, the bottom notch comprising:
a bottom notch base located between the leadframe top side and the leadframe bottom side; and
a bottom notch sidewall extended, adjacent the bottom notch base, from the leadframe bottom side to the bottom notch base;
wherein a depth of bottom notch is greater than a depth of the top notch.

17. An electronic component comprising:
a leadframe comprising:
a leadframe top side;
a leadframe bottom side opposite the leadframe top side; and
a top notch at the leadframe top side and comprising:
a top notch base located between the leadframe top side and the leadframe bottom side, and defining a notch length of the top notch; and
a top notch first sidewall extended, along the notch length, from the leadframe top side to the top notch base;
and
a first semiconductor die comprising:
a die top side;
a die bottom side opposite the die top side and mounted onto the leadframe top side; and
die sidewalls, located between the die top side and the die bottom side, and defining a die perimeter;
wherein:
the top notch is located outside the die perimeter; and
the leadframe comprises a lead having:
a first lead leg having a first leg inner end defining a first section of the top notch first sidewall; and
a second lead leg having a second leg inner end defining a second section of the top notch first sidewall.

18. The electronic component of claim 17, wherein:
the top notch first sidewall is discontinuous between the first leg inner end and the second leg inner end.

19. The electronic component of claim 18, wherein:
the top notch base is discontinuous between the first leg inner end and the second leg inner end.

20. The electronic component of claim 17, further comprising:
a clip comprising a clip tail having a clip edge inserted into the top notch such that a bottom of the clip edge is beneath the leadframe top side,
wherein:
the clip tail protrudes from the top notch past the leadframe top side;
the bottom of the clip edge adjoins the top notch first sidewall at an angle; and a depth of the top notch base relative to the leadframe top side prevents the bottom of the clip edge from direct contact with the top notch base.

21. An electronic component comprising:

a leadframe comprising:
- a leadframe top side comprising:
  - a leadframe top end, along which a leadframe top plane extends;
- a leadframe bottom side comprising:
  - a leadframe bottom end, along which the leadframe bottom plane extends; and
- a top notch comprising:
  - a top notch base located between the leadframe top plane and the leadframe bottom plane, and defining a notch length of the top notch;
  - a top notch first sidewall extended, along the notch length, from the leadframe top side to the top notch base;
  - a notch second sidewall opposite, across the top notch base, to the notch first sidewall; and a semiconductor die mounted atop the leadframe top side, wherein the semiconductor die comprises:
- a die top side;
- a die bottom side mounted atop the leadframe top side; and
- die sidewalls, located between the die top side and the die bottom side, and defining a die perimeter;

a clip coupled from the top notch to the die top side of the semiconductor die, wherein:
- the top notch is disposed laterally outside of the die perimeter;
- the clip comprises a clip edge inserted into the top notch; and
- the clip protrudes from the top notch, past the leadframe top side, to the die top side;

a fusing structure extending between the bottom of the clip edge and the top notch base, wherein:
- the fusing structure fuses the clip edge in the top notch; and
- the fusing structure extends to physically contact the notch second sidewall; and an encapsulant disposed to encapsulate at least portions of the semiconductor die, at least portions of the clip, and at least portions of the leadframe top side.

22. The electronic component of claim 21, wherein:

the clip edge is inserted into the top notch such that a bottom of the clip edge is beneath the leadframe top side;

the bottom of the clip edge adjoins the top notch first sidewall at an angle; and a depth of the top notch base relative to the leadframe top side prevents the bottom of the clip edge from direct contact with the top notch base.

\* \* \* \* \*